United States Patent [19]
Bazes

[11] Patent Number: 5,381,363
[45] Date of Patent: Jan. 10, 1995

[54] METHOD AND CIRCUITRY FOR PERFORMING A HIDDEN READ-MODIFY-WRITE

[75] Inventor: Mel Bazes, Haifa, Israel

[73] Assignee: Intel Corporation, Santa Clara, Calif.

[21] Appl. No.: 807,134

[22] Filed: Dec. 12, 1991

[51] Int. Cl.$^6$ .................... G11C 5/02; G11C 5/06; G11C 7/00
[52] U.S. Cl. ........................ 365/51; 365/63; 365/154; 365/189.04; 365/189.05; 365/203
[58] Field of Search .............. 365/49, 193, 233, 63, 365/52, 51, 189.04, 154, 203, 189.05; 395/425

[56] References Cited

U.S. PATENT DOCUMENTS

| | | | |
|---|---|---|---|
| 5,031,141 | 7/1991 | Guddat et al. | 365/49 |
| 5,065,365 | 11/1991 | Hirayama | 365/189.05 |
| 5,235,543 | 8/1993 | Rosen | 365/154 |

Primary Examiner—Jack B. Harvey
Assistant Examiner—Michael A. Whitfield
Attorney, Agent, or Firm—Blakely, Sokoloff, Taylor & Zafman

[57] ABSTRACT

Circuitry for overlapping a write access of a read-modify-write of a first bit with a subsequent read access of a second bit is described. The circuitry includes a latching circuit and a modify-write circuit. The latching circuit latches the active state of a select signal, which is used to select the SRAM cell storing the first bit during read and write accesses. The modify-write circuit modifies the first bit during the precharge preceding a read access of the second bit provided that it receives an active update write enable signal and an active signal from the latching circuit. Also described is a method of overlapping a read-modify-write cycle of a first SRAM bit with a subsequent read access of a second SRAM bit. The method begins by reading the first SRAM bit. Next, the second SRAM bit is precharged by bringing a precharge signal active. While the precharge signal is active the first SRAM bit is modified. Finally, the second SRAM bit is read after the precharge signal goes inactive.

19 Claims, 5 Drawing Sheets

FIG_3 (PRIOR ART)

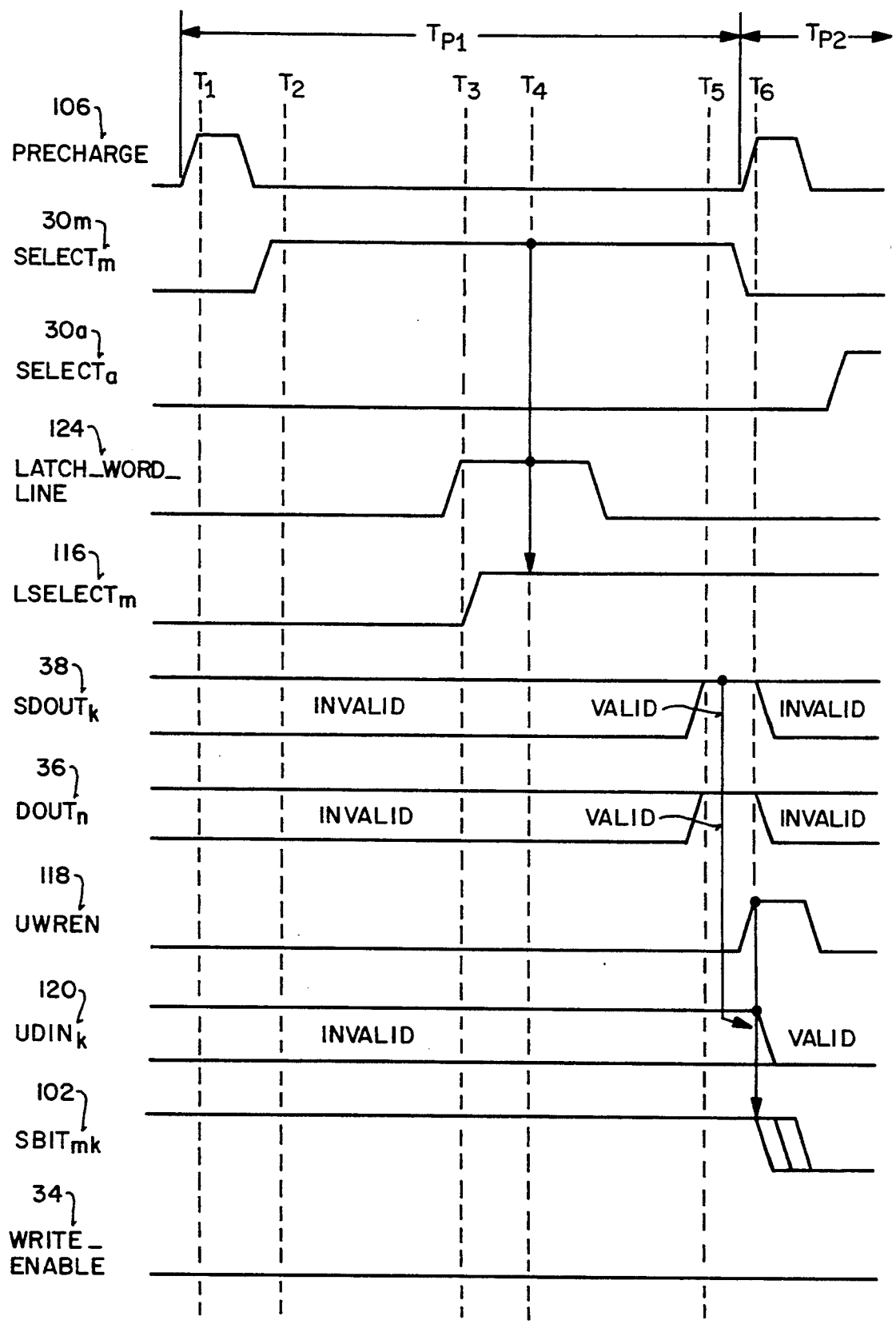

METHOD AND CIRCUITRY FOR PERFORMING A HIDDEN READ-MODIFY-WRITE

FIELD OF THE INVENTION

The present invention pertains to the field of static random access memories (SRAMs). More particularly, the present invention relates to a method and circuitry for performing a hidden read-modify-write using a SRAM.

BACKGROUND OF THE INVENTION

Cache memories store status bits with each data word. Status bits indicate whether their associated data word is valid, access privileges for that word and how recently that word has been accessed.

Status bits are typically updated each time the cache memory is accessed. Read-modify-writes dominate cache memory accesses because updated values of the status bits depend upon the data read out.

Caches memories are typically realized using static random access memories (SRAMs). SRAM cycle time is limited by the time it takes to perform a read cycle. In other words, SRAM cycle time is limited by the time required to perform precharge and a read access. In a high-performance system, where a memory access occurs every clock, the cycle time is exactly equal to the clock period Tp. Thus, the shorter the sum of the precharge time and the read access time the shorter Tp and the higher the clock frequency.

A read-modify-write cycle in prior SRAMs per force requires more time than a read cycle. During a read-modify-write cycle four operations take place in a single clock period, as compared to two operations during a read cycle. The four operations are:

1. Precharge
2. Read Access
3. Data Update
4. Write Access to the same location as the read access.

FIG. 1 illustrates the waveforms for a read-modify-write cycle of a status bit in a prior SRAM. In FIG. 1, a "1" is read out and a "0" is written back. All four operations are performed during a single clock period.

As seen in FIG. 1, a read-modify-write cycle starts out with a precharge and a read access just like a simple read cycle. The third operation, data update, depends upon the data that was read out, and therefore, occurs only after the data has been read out. As the update is generally a complicated operation it typically takes place outside the cache memory in a dedicated circuit. The read-modify-write cycle ends with a write access to the same location as the read access.

Clearly, the additional time required to update the data and execute the write access make a read-modify-write cycle longer than a simple read. Read-modify-write cycles therefore determine the minimum SRAM clock period. Thus, the performance of prior SRAM cache memories is significantly less than would be possible if read-modify-write cycles were not part of normal operation.

SUMMARY OF THE INVENTION

An object of the present invention is to improve SRAM performance in cache memories.

Another object of the present invention is to permit SRAM cache memories to operate at the highest possible clock frequency.

Yet another object of the present invention is to eliminate the performance bottleneck presented by read-modify-write cycles in SRAM cache memories.

Circuitry for overlapping a write access of a read-modify-write cycle of a first bit with a subsequent read access of a second bit is described. The circuitry includes a latching circuit and a modify-write circuit. The latching circuit latches the active state of a select signal, which is used to select the SRAM cell storing the first bit during read and write accesses. The modify-write circuit modifies the first bit during the precharge preceding a read access of the second bit. Modification occurs when the modify-write circuit receives an active latched select signal, and an update write enable signal.

Also described is a method of overlapping a read-modify-write cycle of a first SRAM bit with a subsequent read access of a second SRAM bit. The method begins by reading the first SRAM bit. Next, the second SRAM bit is precharged by bringing a precharge signal active. Finally, while the precharge signal is active the first SRAM bit is modified.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 5 is a timing diagram of a hidden read-modify-write cycle.

DETAILED DESCRIPTION

Figure 2:
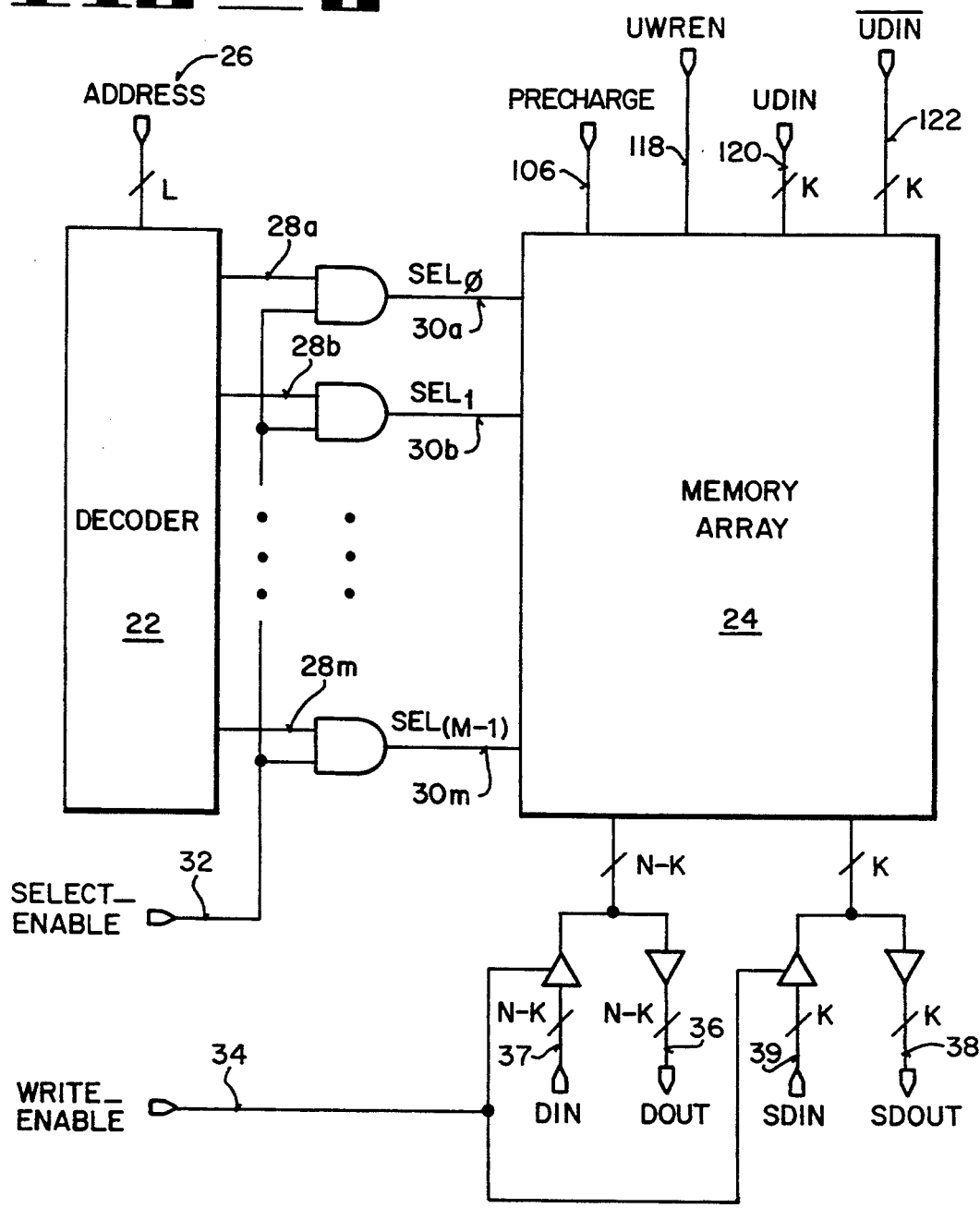
FIG. 2 is a block diagram of a SRAM.

FIG. 2 illustrates in block diagram form an SRAM 20 intended for use in a cache memory. As will be described in detail below, SRAM 20 incorporates the status bit cell and the latch bit cell of the present invention. Using these two bit cells SRAM 20 performs a hidden read-modify-write. The clock period achieved using a hidden read-modify-write is significantly less than that possible using prior read-modify-write cycles. The reduction in clock period is achieved by overlapping the write operation of a hidden read-modify-write of one word with a read access of another word.

SRAM 20 includes decoder 22 and memory array 24, much like any prior SRAM. SRAM 20 varies from prior SRAMS in that memory array 24 includes special cells for bits that are routinely updated, such as status bits.

Decoder 22 selects a row within memory array 24 by decoding the L-bit address signal 26 and bringing active one of the M individual row address lines 28a, 28b ... and 28m. Select signals 30a, 30b. . . and 30m are generated by ANDing select enable signal 32 with row address lines 28a, 28b... and 28m. Given that only a single row address line is active at a time, only a single select signal can be active at a time.

Memory array 24 incorporates special status bit cells, rather than using data bit cells to store status bits. Thus, the N bit words stored by memory array 24 are organized as (N-K) data bits and K status bits. Despite this difference, memory array 24 executes read and write cycles like prior SRAM memory arrays.

The state of WRITE_ENABLE signal 34 determines whether an access is a read or a write. When WRITE_ENABLE 34 is inactive (low) data is read out of memory array 24 and output on (N-K) data output pins, DOUT 36, and K status data output pins, SDOUT 38. On the other hand, if WRITE_ENABLE 34 is active (high), data on data input pins, DIN 37, and status data input pins, SDIN 39, is written into memory array 24 at the appropriate location.

Figure 1:
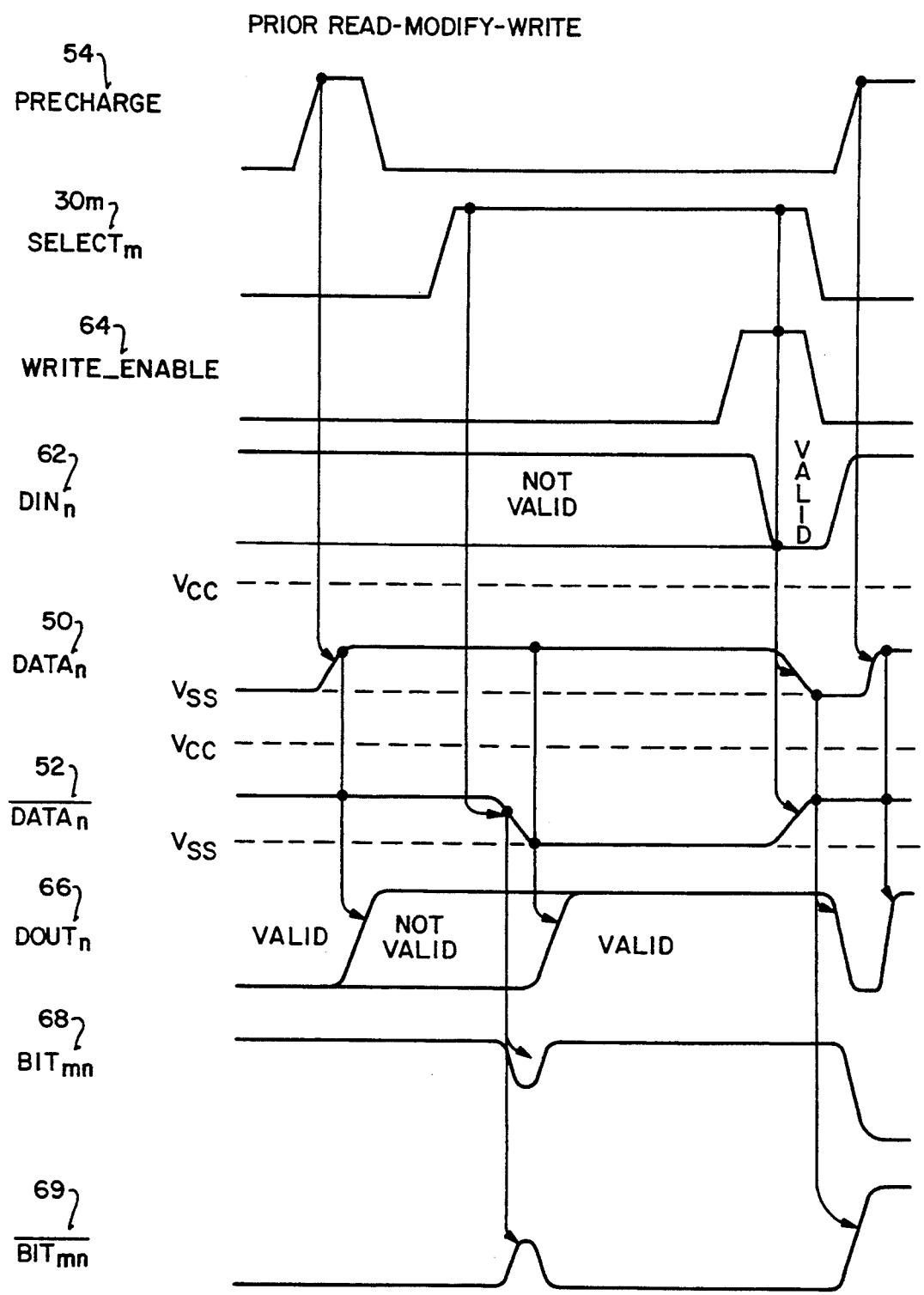
FIG. 1 is a timing diagram of a prior read-modify-write cycle.

SRAM 20 performs hidden read-modify-writes of status bits. Hidden read-modify-write cycles differ from the read-modify-write cycles performed by prior SRAMs. As shown in FIG. 1 prior SRAMs perform the read and write accesses of a read-modify-write cycle in the same clock period. SRAM 20 performs the read and the write operations of a hidden read-modify-write during two clock periods. SRAM 20 in effect hides the modify-write operation of the cycle by performing it during a precharge preceding a subsequent read or read-modify-write of another word.

Modifying status bits associated with one word during a precharge for another word poses at least two difficulties. First, SRAM decoder 22 selects only one row at a time, so how can operations on two rows occur simultaneously? Second, precharge destroys data stored in a bit cell, so how can data be written during precharge?

Figure 3:
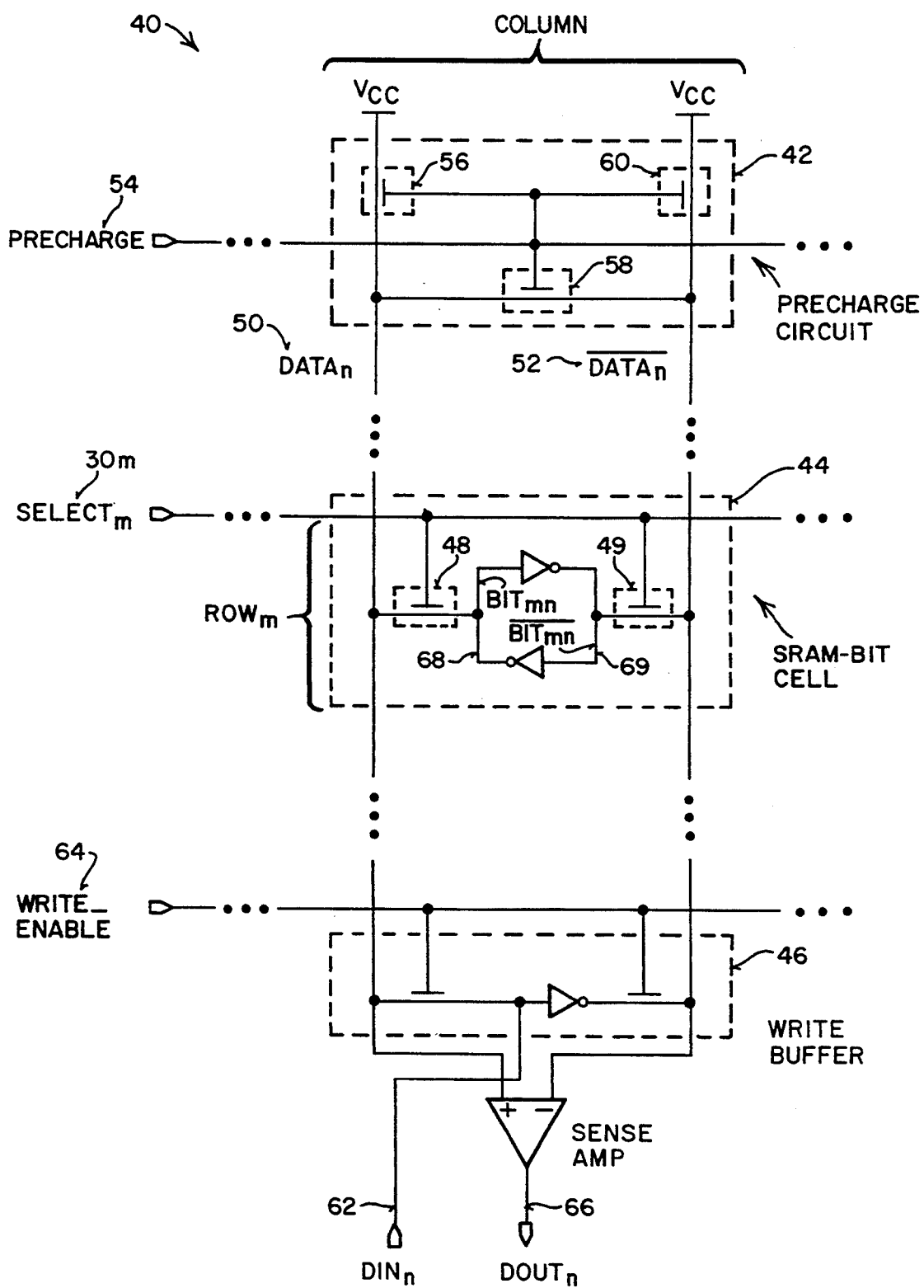
FIG. 3 is a schematic diagram of a prior SRAM column.

These problems and their causes can be better understood with reference to FIG. 3, which illustrates a prior SRAM memory array column 40. Prior memory array column 40 includes a precharge circuit 42, a bit cell 44, and a write buffer 46.

Consider first the need to update the bit stored in bit cell 44, $bit_{mn}$, while another word in another row is selected. Row select signal $SELECT_m$ 30m, which controls pass devices 48 and 49, is inactive. Thus, pass devices 48 and 49 will not conduct, preventing the state of $bit_{mn}$ from changing.

Setting aside the first problem, consider the need to update data during precharge. Precharge signal PRECHARGE 54 is applied to all precharge circuits. PRECHARGE 54 controls pass devices 56, 58, and 60 causing them to conduct while PRECHARGE 54 is active. Pass devices 56, 58, and 60 couple lines $DATA_n$ 50 and $\overline{DATA_n}$ 52 to a high voltage when they conduct. This action prevents $\overline{DIN_n}$ 62 from controlling lines $DATA_n$ 50 and $\overline{DATA_n}$ 52 and determining the state of $bit_{mn}$. Clearly, performing a hidden read-modify-write using the prior SRAM bit cell is impossible.

Figure 4:
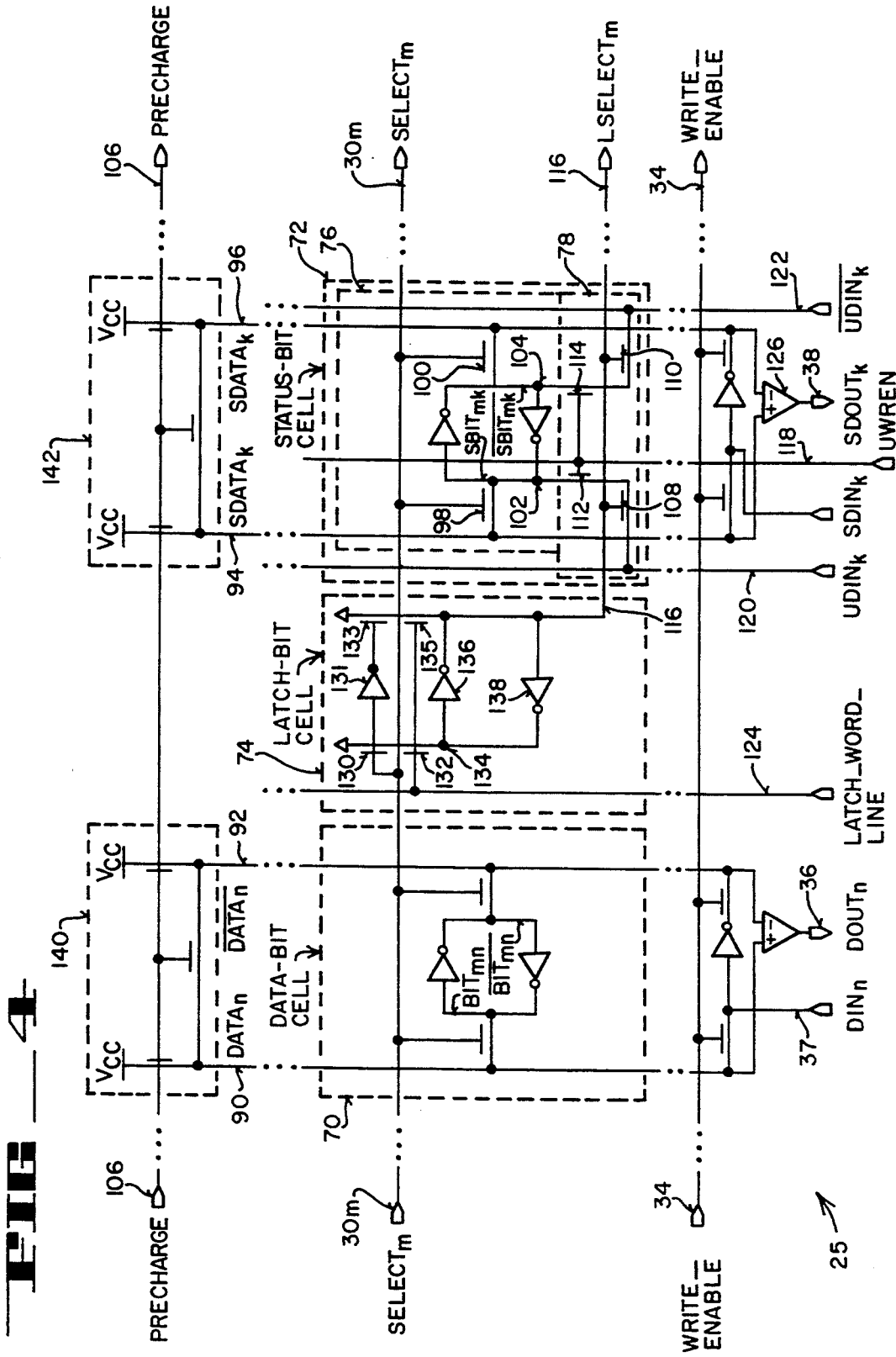
FIG. 4 is a schematic diagram for a SRAM column capable of performing hidden read-modify-writes.

FIG. 4 illustrates a portion 25 of memory array 24 that includes a status bit cell 72 for performing hidden read-modify-write cycles. Memory array 24 includes (N-K) data bit cells per word and K status bit cells per word. However, portion 25 illustrates only one data bit cell 70 and only one status bit cell 72. Each row of memory array 24 includes only latch bit cell 74, as shown in FIG. 4. Latch bit cell 74 generates a latched select signal $LSELECT_m$ 116. $LSELECT_m$ 116 permits modification of a status bit cell while the row select signal associated with the data bit cell is inactive.

Status bit cell 72 includes a bit cell 76 and a modify circuit 78 that allows bit cell 76 to be modified during an active precharge. Bit cell 76 stores the status bit on node $sbit_{mk}$ 102. Bit cell 76 for the most part resembles prior SRAM bit cells and data bit cell 70. For example, both bit cells 70 and 76 incorporate two inverters coupled end-to-end and two pass devices, each connected to an end of the inverters. The pass devices for each bit cell are controlled by $SELECT_m$ 30m. Data bit cell 70 is coupled to complementary signals $DATA_n$ 90 and $\overline{DATA_n}$ 92 via its pass devices. Similarly, bit cell 76 is coupled to $SDATA_k$ 94 and $\overline{SDATA_k}$ 96 via pass devices 98 and 100.

A difference between bit cell 76 and data bit cell 70 is that two complementary signals from modify circuit 78 are coupled to inner nodes 102 and 104 of pass devices 98 and 100. Nodes 102 and 104 are also referred to as $sbit_{mk}$ 102 and $\overline{sbit_{mk}}$ 104. The complementary signals from modify circuit 78 alter the state of status bit 72 while $SELECT_m$ 30m is inactive. Further, because these complementary signals are not applied to lines controlled by PRECHARGE 106 the state of bit cell 76 can be modified while PRECHARGE 106 is active.

The complementary signals applied to nodes 102 and 104 are generated by modify circuit 78. Modify circuit 78 includes two pairs of pass devices 108 and 110, and 112 and 114. The operation of pass devices 108 and 110 is controlled by latched select signal $LSELECT_m$ 116. The operation of pass devices 112 and 114 is controlled by update write enable signal UWREN 118. Both $LSELECT_m$ 116 and UWREN 118 must be active before the complementary status update signals $UDIN_k$ 120 and $\overline{UDIN_k}$ 122 can be coupled to nodes 102 and 104.

$LSELECT_m$ 116 allows the status bits in row m to be modified while $SELECT_m$ 30m is inactive and thus enables operations on two words to occur while only one word is selected. Latched select signal $LSELECT_m$ 116 is generated by latch bit cell 74. Latch bit cell 74 is a flip-flop that latches the active state of $SELECT_m$ 30m when enabled by LATCH_WORD_LINE signal 124.

The operation of SRAM 20 during a hidden read-modify-write can be understood with reference to the timing diagram of FIG. 5. FIG. 5 illustrates one complete clock period, $T_{p1}$ and a portion of a second clock period, $T_{p2}$. Both clock periods begin when PRECHARGE 106 is brought active (high). Note that the hidden read-modify-write of $sbit_{mk}$ 102 begins during one clock period, $T_{p1}$, and is completed during a subsequent clock period, $T_{p2}$.

The hidden read-modify-write begins at time $T_1$ when PRECHARGE 106 is brought active. Most other inputs from external circuitry remain inactive; e.g. $SELECT_m$ 30m, WRITE_ENABLE 34, LATCH_WORD_LINE 124, UWREN 118, and $UDIN_k$ 120. Precharge circuit 140 responds to active PRECHARGE 106 by pulling $DATA_n$ 90 and its complement 92 to a high voltage, approximately $V_{CC}-V_T$. Precharge circuit 142 responds analogously, pulling $SDATA_k$ 94 and its complement 96 to a high voltage. No change occurs in the state of $bit_{mn}$ or $sbit_{mk}$ 102 because none of the pass devices associated with these bits is conducting.

Precharging has no effect upon latch bit cell 74 because it is not coupled to PRECHARGE 106.

At time $T_2$ PRECHARGE 106 is inactive and the row select signal $SELECT_m$ 30m is active. Other inputs from external circuitry remain inactive.

Assume that both status cell 72 and data bit cell 70 store a logic 1; i.e. that both $bit_{mn}$ and $sbit_{mk}$ 102 are at a logic 1 and their complements are at a logic 0. In that case, both bit cells 70 and 72 respond to active SELECT$_m$ 30$m$ similarly. Pass devices 98 and 100 within bit cell 76 turn on connecting SDATA$_k$ 94 and $\overline{\text{SDATA}_k}$ 96 to nodes sbit$_{mk}$ 102 and $\overline{\text{sbit}_{mk}}$ 104. Because $\overline{\text{sbit}_{mk}}$ 104 is at zero volts, it slowly discharges SDATA$_k$ 96 toward zero volts. On the other hand, because sbit$_{mk}$ 102 is at V$_{CC}$ it hardly affects SDATA$_k$ 94.

Sense amplifier 126 senses the differential voltage developing between SDATA$_k$ 94 and $\overline{\text{SDATA}_k}$ 96 and rapidly amplifies it to a level that can be recognized by a CMOS logic gate. This level is output as SDOUT$_k$ 38 at T$_5$. At T$_5$ data bit cell 70 outputs substantially the same level at DOUT$_n$ 36.

At time T$_3$ a hidden read-modify-write is signalled to SRAM 20 by LATCH_WORD_LINE 124 going active (high) while SELECT$_m$ 30$m$ is active. The manner of signalling a hidden read-modify-write differs from prior read-modify-writes in that it is not initiated by WRITE_ENABLE 34.

Latch bit cell 74 responds to active SELECT$_m$ 30$m$ and LATCH_WORD_LINE 124 as follows: Pass device 130 couples the low voltage level, approximately zero volts, to pass device 132. When LATCH_WORD_LINE 124 goes active (high), pass device 132 couples node 134 to ground. After connection to ground, node 134 falls from its formerly high voltage to ground. Inverters 136 and 138 respond to the change of voltage at node 134 by pulling LSELECT$_m$ 116 active (high) at time T$_4$.

LSELECT$_m$ 116 remains active (high) after SELECT$_m$ 30$m$ goes inactive and during the precharge at T$_6$. In fact, LSELECT$_m$ 116 remains high until the next time LATCH_WORD_LINE 124 goes active (high) while SELECT$_m$ 30$m$ is inactive. In other words, LSELECT$_m$ 116 is cleared by the first hidden-read-modify-write of a word in a row other than row m.

As the updated values of status bits depend on values read out the status bits, they cannot be updated until after their associated data has been read out. In other words, the data stored in status bit cell 72 cannot be updated until after T$_5$, when SDOUT$_k$ 38 is valid. After circuitry external to SRAM 20 has had enough time to latch DOUT$_n$ 36 and SDOUT$_k$ 38 another access can begin. Simultaneously, the data stored in status bit cell 72 can be modified.

A read or read-modify-write of a word in another row, say row a, begins at time T$_6$ when PRECHARGE 106 is pulled active (high) again. The hidden read-modify-write of the status bits in row m continues at the same time with update write enable signal UWREN 118 also going active (high). As UWREN 118 goes active it couples update signal UDIN$_k$ 120 and its complement 122 to nodes 102 and 104 respectively. At the start of the precharge the update data applied to 120 and 122 may be invalid because the external circuitry may not have completed calculating the updated status. However, near the end of the active precharge valid update data is available and written into status bit cell 72 prior to UWREN 118 going inactive. Modify circuit 78 is stronger than bit cell 76 and overpowers it when the update data and the stored data differ, forcing sbit$_{mk}$ 102 to the state determined by UDIN$_k$ 120.

Thus, circuitry and a method of performing a hidden read-modify-write has been described. The circuitry includes a modify circuit and a latch bit circuit. Using these circuits the write operation in a read-modify-write cycle for one bit may be performed during a precharge preceding a read access of another bit.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. Circuitry for overlapping a write access of a read-modify-write cycle of a first bit stored in a first SRAM cell with an active state of a precharge signal preceding a read access of a second bit stored in a second SRAM cell, the first bit being read in response to an active state of a select signal, the circuitry comprising:
   a) latching means for latching the active state of the select signal; and
   b) modify-write means for modifying a state of the first bit while the update write enable signal is active, the modify-write means coupled to the first SRAM cell and the latching means, the modify-write means responsive to an update write enable signal having an active state during the active state of the precharge signal.

2. The circuitry of claim 1 wherein the latching means comprises a flip-flop, the flip-flop latching the select signal in response to a latch enable signal.

3. The circuitry of claim 2 wherein the flip-flop comprises:
   a) a first pass device coupled to receive a first voltage level and responsive to the select signal;
   b) a first inverting circuit having an input coupled to receive the select signal;
   c) a second pass device coupled to the first voltage level and responsive to an output of the first inverting circuit;
   d) a third pass device coupled to first pass device and responsive to the latch enable signal;
   e) a fourth pass device coupled to the second pass device and responsive to the latch enable signal;
   f) a second inverting circuit having an input coupled to the third pass device and an output coupled to the fourth pass device and the modify write means; and
   g) a third inverting circuit having an input coupled to the output of the second inverting circuit and an output coupled to the input of the second inverting circuit.

4. The circuitry of claim 3 wherein the first voltage level is ground.

5. The circuitry of claim 1 wherein the modify-write means is coupled to receive an update data signal, the modify-write means modifying the state of the first bit according to a state of the update data signal.

6. The circuitry of claim 5 wherein the modify-write means comprises:
   a) a fifth pass device coupled to the update data signal and responsive to the latching means;
   b) a sixth pass device coupled to a complement of the update data signal and responsive to the latching means;
   c) a seventh pass device coupled to the fifth pass device, the first SRAM cell, and responsive to the update enable signal; and d) an eighth pass device coupled to the sixth pass device, the first SRAM cell and responsive to the update enable signal.

7. Circuitry for overlapping a write operation of a read-modify-write cycle of a first bit with an active state of a precharge signal preceding a read operation of a second bit, the circuitry comprising:

a) a first SRAM cell storing the first bit and a second SRAM cell storing the second bit, the first SRAM cell being coupled to receive a select signal, the first SRAM cell reading out the first bit in response to an active state of the select signal;

b) a latching means for latching the active state of the select signal and outputting a latched select signal;

c) a modify-write means for modifying the first bit, the modify write means coupled to the first SRAM bit cell, responsive to the latched select signal, responsive to an update data signal having a state, and responsive to an update write enable signal having an active state during the active state of the precharge signal, the modify-write means modifying the first bit according to the state of the update data signal during the active period of the update write enable signal.

8. The circuitry of claim 7 wherein the latching means comprises a flip-flop, the flip-flop latching the select signal in response to a latch enable signal.

9. The circuitry of claim 8 wherein the flip-flop comprises:

a) a first pass device coupled to a first voltage level and responsive to the select signal;

b) a first inverting circuit having an input coupled to receive the select signal;

c) a second pass device coupled to the first voltage level and responsive to an output of the first inverting circuit;

d) a third pass device coupled to the first pass device and responsive to a latch enable signal;

e) a fourth pass device coupled to the second pass device and responsive to the latch enable signal;

f) a second inverting circuit having an input coupled to the third pass device and an output coupled to the fourth pass device and the modify-write means; and g) a third inverting circuit having an input coupled to the output of the second inverting circuit and an output coupled to the input of the second inverting circuit.

10. The circuitry of claim 9 wherein the first voltage level is ground.

11. The circuitry of claim 7 wherein the modify-write means comprises;

a) a fifth pass device coupled the update data signal and responsive to the second inverting circuit;

b) a sixth pass device coupled to a complement of the update data signal and responsive to the second inverting circuit;

c) a seventh pass device coupled to the fifth pass device, the first SRAM cell, and responsive to the update write enable signal; and d) an eighth pass device coupled to the sixth pass device, the first SRAM cell and responsive to the update write enable signal.

12. Circuitry for overlapping a write operation of a read-modify-write cycle of a first bit with an active state of a precharge signal preceding a read of a second bit, the circuitry comprising:

a) a first SRAM cell storing the first bit and a second SRAM cell storing the second bit, the first SRAM cell being coupled to receive a select signal, the first SRAM cell reading out the first bit in response to an active state of the select signal;

b) a latching means for latching the active state of the select signal, the latching means comprising:

1) a first pass device coupled to a first voltage level and responsive to the select signal;

2) a first inverting circuit having an input coupled to receive the select signal;

3) a second pass device coupled to the first voltage level and responsive to an output of the first inverting circuit;

4) a third pass device coupled to the first pass device and responsive to a latch enable signal;

5) a fourth pass device coupled to the second pass device and responsive to the latch enable signal;

6) a second inverting circuit outputting a latched select signal, the second inverting circuit having an input coupled to the third pass device and an output coupled to the fourth pass device; and 7) a third inverting circuit having an input coupled to receive the latched select signal and an output coupled to the input of the second inverting circuit;

c) a modify-write means modifying a state of the first bit, the modify-write means comprising:

1) a fifth pass device coupled to an update data signal and responsive to the latched select signal;

2) a sixth pass device coupled to a complement of the update data signal and responsive to the latched select signal;

3) a seventh pass device coupled to the fifth pass device, the first SRAM cell, and responsive to an update write enable signal, the update write enable signal having an active state during the active state of the precharge signal; and 4) an eighth pass device coupled to the sixth pass device, the first SRAM cell and responsive to the update write enable signal.

13. The circuitry of claim 12 wherein the first voltage level is ground.

14. A method of overlapping a read-modify-write of a first SRAM bit being stored in a first memory cell with a subsequent read of a second SRAM bit being stored in a second memory cell, the method comprising the steps of:

a) reading the first SRAM bit;

b) placing a precharge voltage on a bit line coupled to the second memory cell by bringing a precharge signal active; and c) writing into the first SRAM bit while the precharge signal is active.

15. The method of claim 14 further comprising the steps of:

a) bringing a select signal active prior to reading the first SRAM bit; and b) enabling a latching means for latching the active select signal.

16. The method of claim 15 further comprising the steps of:

a) providing an update write enable signal having an active state while the precharge signal is active; and b) providing an update data signal and a update data complement signal, the update data signal having a state determining a state of the first SRAM bit.

17. A method of overlapping a read-modify-write of a first status bit stored in a first memory cell with a subsequent read of a second status bit stored in a second memory cell, the method comprising the steps of:
   a) reading the first status bit while a select signal is active;
   b) placing a precharge voltage on it bit line coupled to the second memory cell by bringing a precharge signal active; and
   c) modifying a state of the first status bit according to an update data signal while an update enable signal and the precharge signal are active.

18. The method of claim 17 further comprising the steps of:
   a) bringing the select signal active prior to reading the first status bit; and
   b) enabling a latching means for latching the active select signal and generating a latched select signal, the latched select signal enabling modification of the first status bit while the select signal is inactive.

19. A method of overlapping a read-modify-write of a first status bit stored in a first memory cell with a subsequent read of a second status bit stored in a second memory cell, the method comprising the steps of:
   a) bringing a first select signal active;
   b) latching the active first select signal to generate a latched select signal for modifying the first status bit;
   c) reading the first status bit while the select signal is active;
   d) bringing the first select signal inactive;
   e) placing a precharge voltage on it bit line coupled to the second memory cell by bringing a precharge signal active;
   f) bringing an update write enable signal active while the precharge signal is active;
   g) providing an update data signal having a state; and
   h) writing the state of the update data signal to the first memory cell while the update write enable signal is active.

* * * * *

UNITED STATES PATENT AND TRADEMARK OFFICE
CERTIFICATE OF CORRECTION

PATENT NO. : 5,381,363
DATED : January 10, 1995
INVENTOR(S) : Mel Bazes

It is certified that error appears in the above-indentified patent and that said Letters Patent is hereby corrected as shown below:

In column 9 at line 7 delete "it" and insert --a--

In column 10 at line 12 delete "it" and insert --a--

Signed and Sealed this

Seventeenth Day of December, 1996

Attest:

BRUCE LEHMAN

Attesting Officer     Commissioner of Patents and Trademarks